(12) United States Patent
Yang et al.

(10) Patent No.: US 11,335,683 B2
(45) Date of Patent: May 17, 2022

(54) DEVICE CHANNEL PROFILE STRUCTURE

(71) Applicant: QUALCOMM Incorporated, San Diego, CA (US)

(72) Inventors: Haining Yang, San Diego, CA (US); ChihWei Kuo, Hsinchu County (TW); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/917,451

(22) Filed: Jun. 30, 2020

(65) Prior Publication Data

US 2021/0407998 A1 Dec. 30, 2021

(51) Int. Cl.
| | | |
|---|---|---|
| *H01L 27/092* | (2006.01) | |
| *H01L 29/10* | (2006.01) | |
| *H01L 29/78* | (2006.01) | |
| *H01L 29/06* | (2006.01) | |
| *H01L 29/423* | (2006.01) | |
| *H01L 29/786* | (2006.01) | |

(Continued)

(52) U.S. Cl.
CPC .... *H01L 27/0922* (2013.01); *H01L 21/02603* (2013.01); *H01L 21/823807* (2013.01); *H01L 21/823821* (2013.01); *H01L 27/0924* (2013.01); *H01L 29/0673* (2013.01); *H01L 29/1037* (2013.01); *H01L 29/42392* (2013.01); *H01L 29/66742* (2013.01); *H01L 29/66818* (2013.01); *H01L 29/785* (2013.01); *H01L 29/78696* (2013.01)

(58) Field of Classification Search
CPC ............. H01L 27/0922; H01L 27/0924; H01L 29/0673; H01L 29/1037; H01L 29/42392; H01L 29/66742; H01L 29/66818; H01L 29/785; H01L 29/78696; H01L 21/02603; H01L 21/823807; H01L 21/823821
USPC ......................................................... 257/351
See application file for complete search history.

(56) References Cited

U.S. PATENT DOCUMENTS

| | | |
|---|---|---|
| 9,728,621 B1 | 8/2017 | Cheng et al. |
| 10,490,559 B1 | 11/2019 | Ando et al. |

(Continued)

FOREIGN PATENT DOCUMENTS

| | | |
|---|---|---|
| CN | 108172549 A | 6/2018 |
| WO | 2018200006 A1 | 11/2018 |

OTHER PUBLICATIONS

International Search Report and Written Opinion—PCT/US2021/034840—ISA/EPO—dated Aug. 18, 2021.

*Primary Examiner* — Tong-Ho Kim
(74) *Attorney, Agent, or Firm* — Muncy, Geissler, Olds & Lowe, P.C.

(57) ABSTRACT

A transistor channel profile structure may be improved to provide better transistor circuits performance. In one example, a transistor circuit may include different fin profiles for the NMOS transistors and the PMOS transistors, such as the NMOS fins are thicker than the PMOS fins or the NMOS fin has a straight vertical surface and the PMOS fin has a notch at a fin bottom region. In still another example, a transistor circuit may include different nano-sheet profiles for a NMOS GAA device and a PMOS GAA device where the NMOS nano-sheet is thicker than the PMOS nano-sheet. Such configurations optimize the NMOS and the PMOS transistors with the NMOS having a low channel resistance while the PMOS has a lower short channel effect.

28 Claims, 11 Drawing Sheets

(51) Int. Cl.
*H01L 29/66* (2006.01)
*H01L 21/02* (2006.01)
*H01L 21/8238* (2006.01)

(56) References Cited

U.S. PATENT DOCUMENTS

| | | |
|---|---|---|
| 2009/0309162 A1* | 12/2009 | Baumgartner ...... H01L 29/7856 257/368 |
| 2012/0086053 A1 | 4/2012 | Tseng et al. |
| 2015/0069474 A1* | 3/2015 | Ching ................ H01L 21/2253 257/288 |
| 2015/0364542 A1 | 12/2015 | Rodder et al. |
| 2017/0069630 A1* | 3/2017 | Cha ................ H01L 21/823821 |
| 2017/0104060 A1 | 4/2017 | Balakrishnan et al. |
| 2018/0053690 A1 | 2/2018 | Wang et al. |
| 2018/0108732 A1 | 4/2018 | Shu et al. |
| 2018/0247938 A1* | 8/2018 | Cheng ................ H01L 27/0886 |
| 2018/0337183 A1 | 11/2018 | Glass et al. |
| 2019/0096669 A1 | 3/2019 | Bi et al. |
| 2020/0020690 A1* | 1/2020 | Ando ................ H01L 29/0673 |
| 2020/0058739 A1 | 2/2020 | Liaw |
| 2020/0098756 A1* | 3/2020 | Lilak ................ H01L 29/66545 |
| 2020/0105622 A1* | 4/2020 | Hsu ................ H01L 21/823871 |
| 2020/0135728 A1* | 4/2020 | Liaw ................ H01L 27/0886 |
| 2020/0185539 A1* | 6/2020 | Lee ................ H01L 29/513 |
| 2021/0280684 A1 | 9/2021 | Lu |

* cited by examiner

A-A

B-B

DEVICE CHANNEL PROFILE STRUCTURE

FIELD OF DISCLOSURE

This disclosure relates generally to transistors, and more specifically, but not exclusively, to transistor channel profiles.

BACKGROUND

Transistor based devices are becoming more prevalent, such as complementary metal oxide semiconductor (CMOS) transistors, fin field effect transistors (finfet), and non-sheet gate-all-around (GAA) transistors, which is driving a need for better and smaller transistors. CMOS transistors are scaling from planar transistor to finfet, and are migrating to nano-sheet gate-all-around (GAA) devices. As manufacturing technology scales down to 5 nm nodes, the manufacturing process becomes more complex and device performance becomes difficult to further improve. Finfet and GAA device scaling is limited by a short channel effect and a high channel resistance. For instance, the fin profile (top and bottom thickness) and GAA nano-sheet thickness are critical for finfet and GAA device short channel effect (leakage) and drive current performance. In addition, the problem complexity increases since NMOS finfets and PMOS finfets have different responses to different channel profiles. For example, n-channel metal oxide semiconductor (NMOS) transistors require a lower channel resistance for high performance while P-channel metal oxide semiconductor (PMOS) transistors require a thinner channel to control short channel effect.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a transistor circuit comprises: a first finfet transistor comprising a first fin with a first width; and a second finfet transistor comprising a second fin with a second width, wherein the first width is less than the second width.

In another aspect, a transistor circuit comprises: a first means to amplify and switch comprising a first fin with a first width; and a second means to amplify and switch comprising a second fin with a second width, wherein the first width is less than the second width.

In still another aspect, a transistor circuit comprises: a first gate-all-around (GAA) transistor comprising a first channel with a first thickness; and a second GAA transistor comprising a second channel with a second thickness, wherein the first thickness is more than the second thickness.

In still another aspect, a method for manufacturing a transistor circuit comprises: providing a silicon substrate; forming a first fin of a first finfet transistor on the silicon substrate; forming a second fin of a second finfet transistor on the silicon substrate proximate to the first fin; trimming a first width of the first fin, the trimmed first width less than a second width of the second fin; and forming a gate on the first fin and the second fin.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
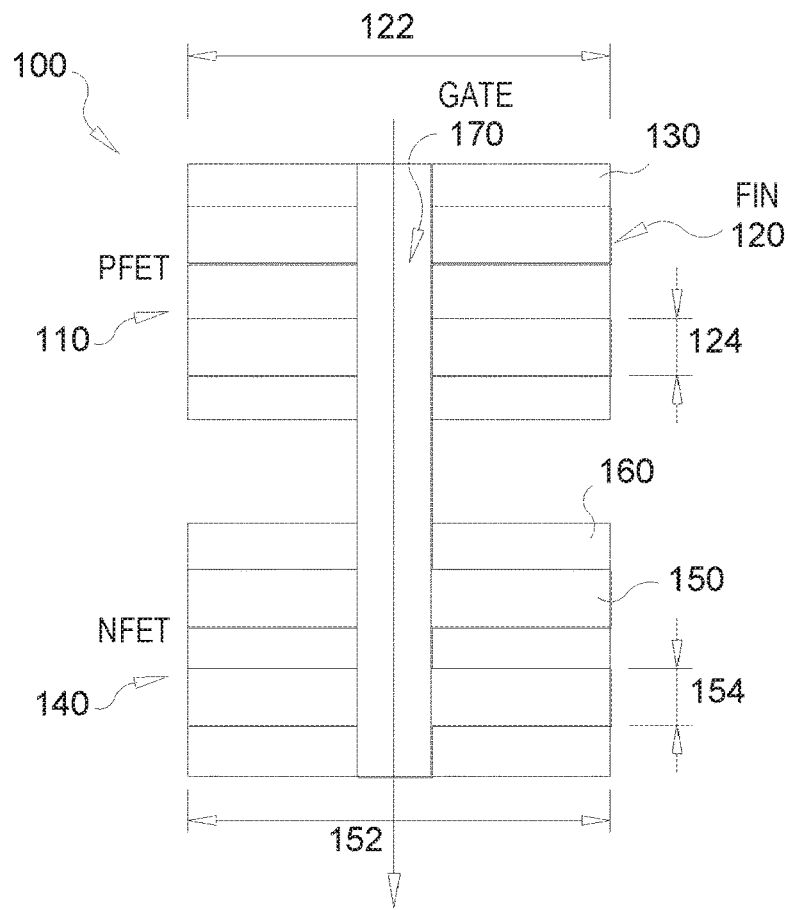
FIGS. 1A-B illustrate an exemplary transistor circuit with different fin widths in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Examples herein include a profile structure for improved channel performance of a transistor circuits. In one example, a transistor circuit consists of different fin profiles for the NMOS transistors and the PMOS transistors, where the NMOS fins are thicker than the PMOS fins (at both top and bottom of fin). In another example, a transistor circuit consists of different fin profiles for the NMOS and the PMOS transistors respectively where the NMOS fin has a straight vertical surface, and the PMOS fin has a notch at a fin bottom region. In still another example, a transistor circuit consists of different nano-sheet profiles for a NMOS GAA device and a PMOS GAA device, where the NMOS nano-sheet is thicker than the PMOS nano-sheet. In such examples, both the NMOS and the PMOS transistors are optimized with the NMOS having a low channel resistance (hence higher drive current) while the PMOS has a lower short channel effect (hence lower leakage).

Figure 1B:
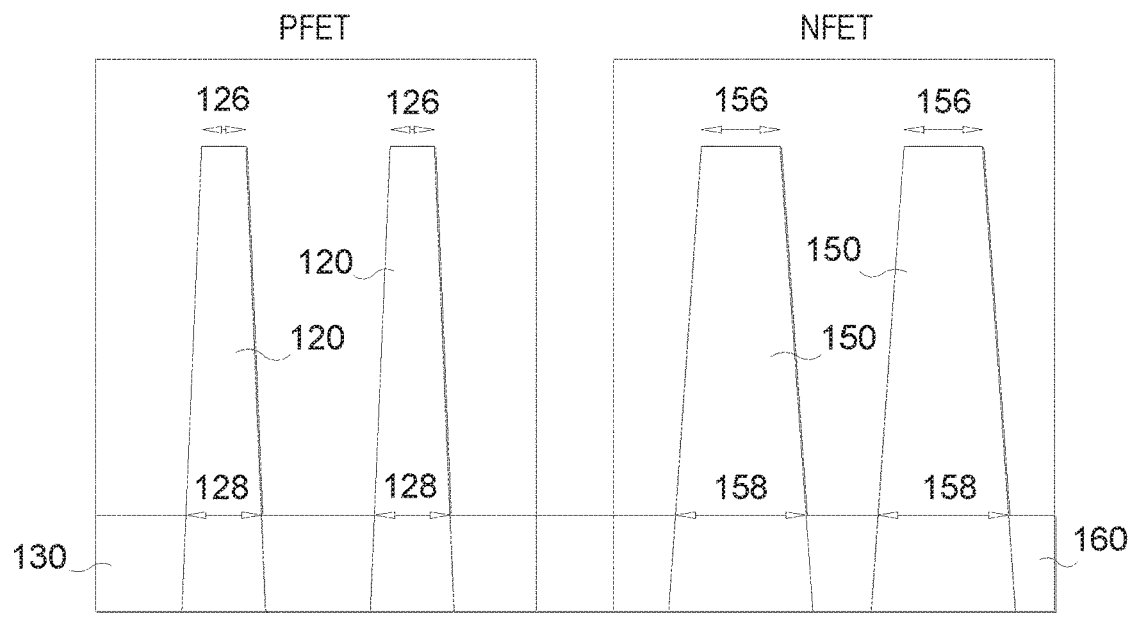

FIGS. 1A-B illustrate an exemplary transistor circuit with different fin widths in accordance with some examples of the disclosure. As shown in FIG. 1A, a transistor circuit 100 may include a first transistor 110 (e.g., P-type finfet) with a first fin 120 and a first substrate 130 (e.g., silicon, silicon germanium, or similar material), a second transistor 140 (e.g., N-type finfet) with a second fin 150 and a second substrate 160, and a shared gate 170. While the first transistor 110 and the second transistor 140 are shown with two fins, separate substrates, and a shared gate, it should be understood that each transistor may have more or less fins, the number of fins may differ between the first transistor 110 and the second transistor 140, a common substrate may be used instead of separate substrates, and separate gates may be used instead of a common or shared gate.

FIG. 1B shows a side view along the cut lines in FIG. 1A. As shown in the top view of FIG. 1A, each first fin 120 has a first length 122 and a first width 124 and each second fin 150 has a second length 152 and a second width 154. As shown in FIG. 1B, the first width 124 comprises a first top width 126 and a first bottom width 128 and the first top width 126 is less than the first bottom width 128. The first bottom width 128 is closer to the first substrate 130 than the first top width 126. As shown in FIG. 1B, the second width 154 comprises a second top width 156 and a second bottom width 158 and the second top width 156 is less than the second bottom width 158. The second bottom width 158 is closer to the second substrate 160 than the second top width 156. In addition, the first top width 126 is smaller or less than the second top width 156 and the first bottom width 128 is smaller or less than the second bottom width 158. A longer or larger width in the fin profile decreases resistance and makes the fin less susceptible to short channel effects (beneficial for n-type finfets). In contrast, a shorter or smaller width in the fin profile may increase resistance but make the fin more susceptible to short channel effects, which in turn makes the short channel effects (high leakage current) more controllable (beneficial for p-type finfets).

Figure 2A:
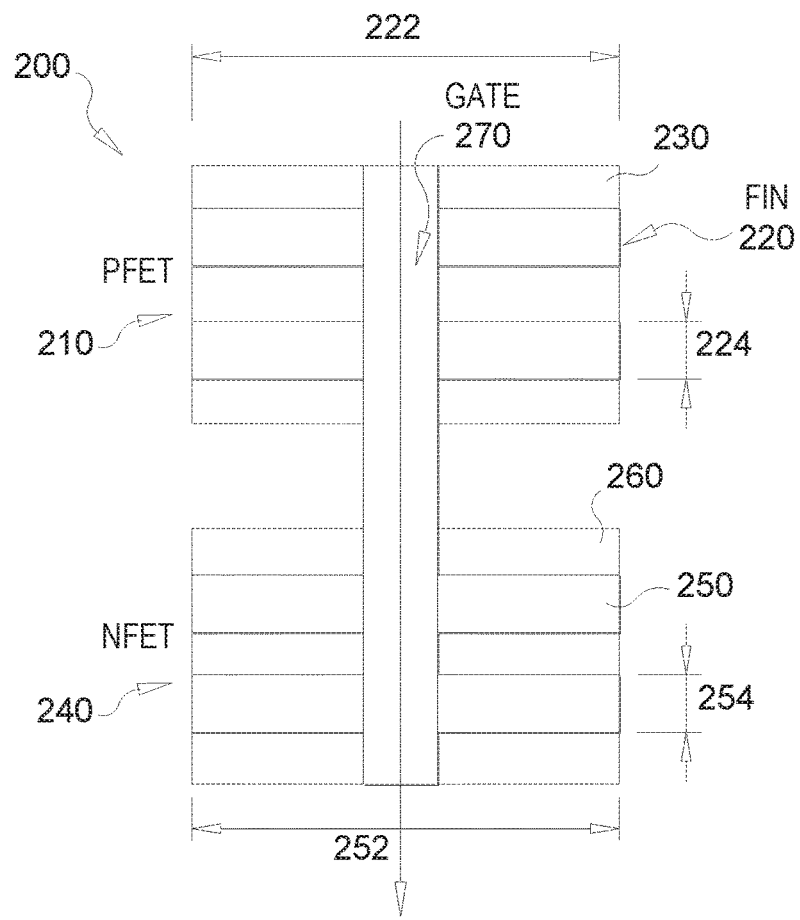
FIGS. 2A-B illustrate an exemplary transistor circuit with fin notches in accordance with some examples of the disclosure.
Figure 2B:
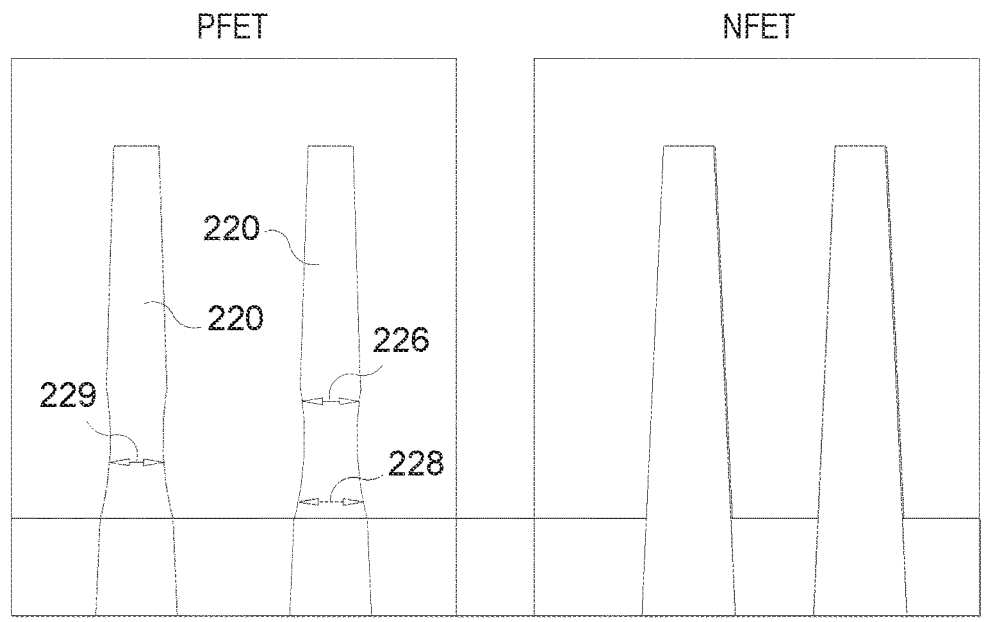

FIGS. 2A-B illustrate an exemplary transistor circuit with fin notches in accordance with some examples of the disclosure. As shown in FIG. 2A, a transistor circuit 200 (e.g., transistor circuit 100) may include a first transistor 210 (e.g., P-type finfet) with a first fin 220 and a first substrate 230 (e.g., silicon, silicon germanium, or similar material), a second transistor 240 (e.g., N-type finfet) with a second fin 250 and a second substrate 260, and a shared gate 270. While the first transistor 210 and the second transistor 240 are shown with two fins, separate substrates, and a shared gate, it should be understood that each transistor may have more or less fins, the number of fins may differ between the first transistor 210 and the second transistor 240, a common substrate may be used instead of separate substrates, and separate gates may be used instead of a common or shared gate.

FIG. 2B shows a side view along the cut lines in FIG. 2A. As shown in the top view of FIG. 2A, each first fin 220 has a first length 222 and a first width 224 and each second fin 250 has a second length 252 and a second width 254. As shown in FIG. 2B, the first width 224 comprises a first top width 226, a first notch width 229, and a first bottom width 228. The first top width 226 is less than the first bottom width 228 and the first notch width 229 is less than the first bottom width 228. The first notch width 229 may be the same, larger, or smaller than the first top width 226. A shorter or smaller width at the notch location near the bottom may increase resistance but make the fin more susceptible to short channel effects, which in turn makes the short channel effects (high leakage current) more controllable (beneficial for p-type finfets).

Figure 3A:
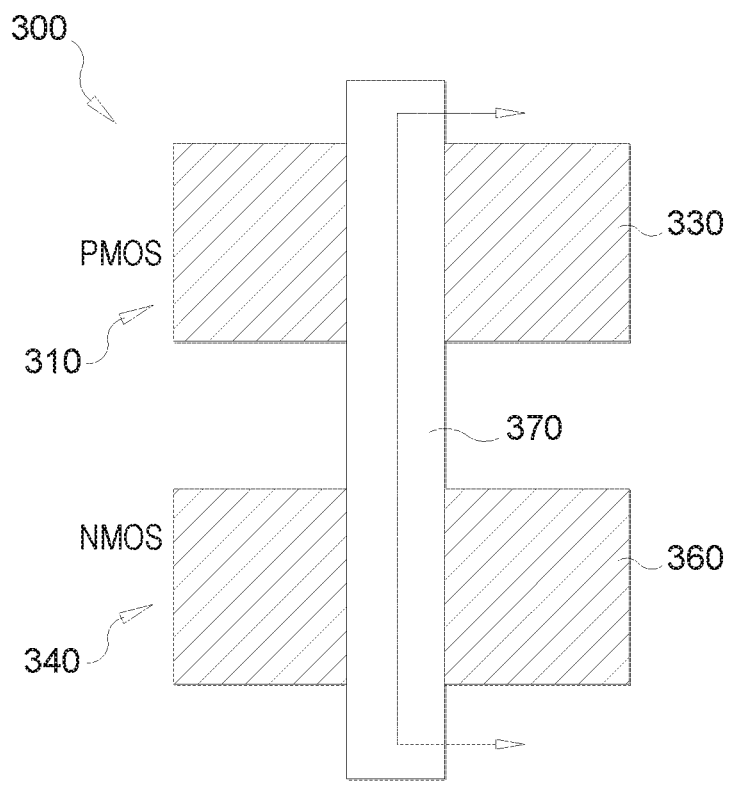
FIGS. 3A-B illustrate an exemplary transistor circuit with different nano-sheet thicknesses in accordance with some examples of the disclosure.
Figure 3B:
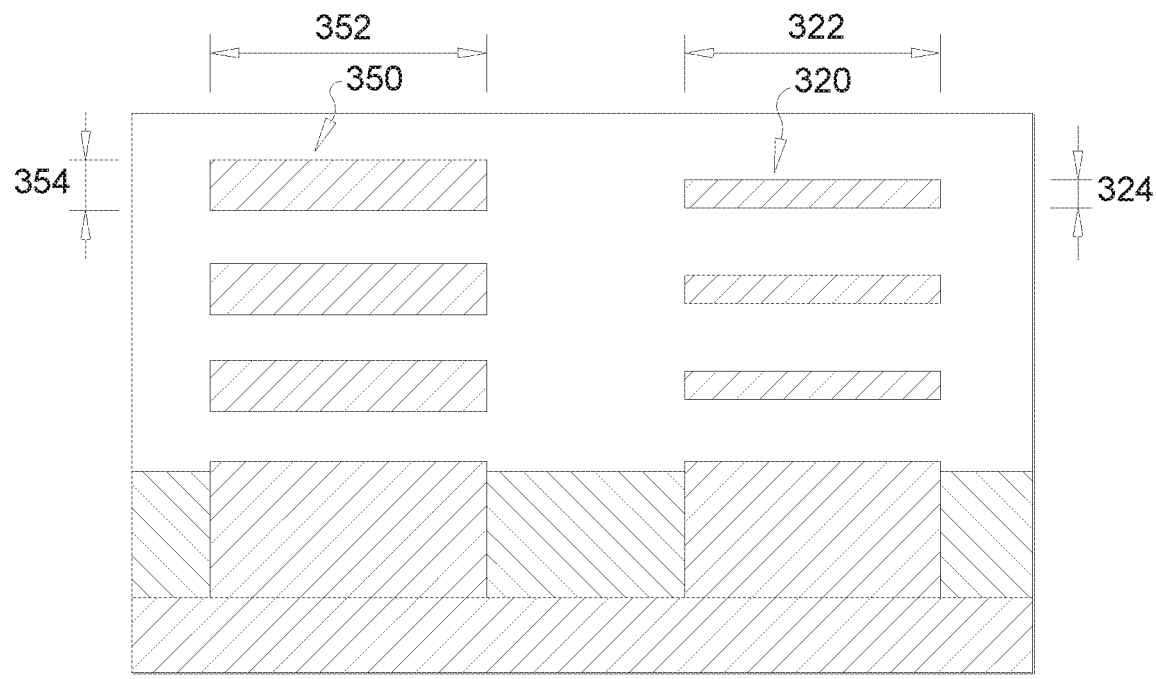

FIGS. 3A-B illustrate an exemplary transistor circuit with different nano-sheet thicknesses in accordance with some examples of the disclosure. As shown in FIG. 3A, a transistor circuit 300 may include a first transistor 310 (e.g., P-type GAA device) with a first substrate 330 (e.g., silicon, silicon germanium, or similar material), a second transistor 340 (e.g., N-type GAA device) with a second substrate 360, and a shared gate 370. While the first transistor 310 and the second transistor 340 are shown with separate substrates and a shared gate, it should be understood that a common substrate may be used instead of separate substrates and separate gates may be used instead of a common or shared gate.

FIG. 3B shows a side view along the cut lines in FIG. 3A. As shown in FIG. 3B, the first transistor 310 comprises a first channel 320 with a first thickness 324, the second transistor 340 comprises a second channel 350 with a second thickness 354, and the first thickness 324 smaller or less than the second thickness 354. A smaller thickness in the channel profile may increase resistance but make the fin more susceptible to short channel effects, which in turn makes the short channel effects (high leakage current) more controllable (beneficial for p-type GAA devices).

Figure 4A:
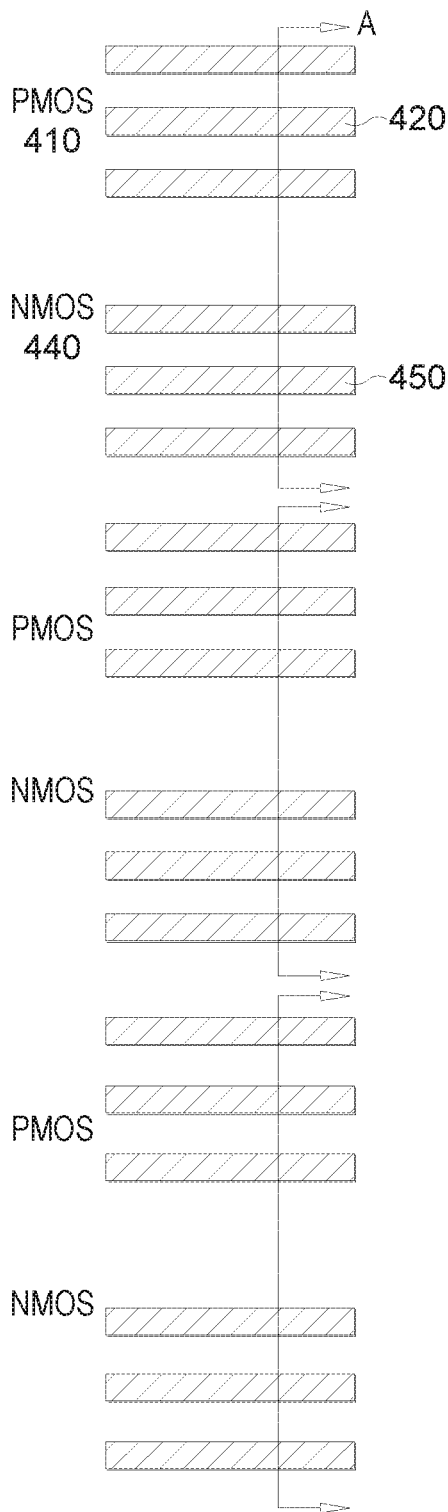
FIGS. 4A-I illustrate an exemplary partial methods for manufacturing a transistor circuit with different fin widths in accordance with some examples of the disclosure.
Figure 4A:
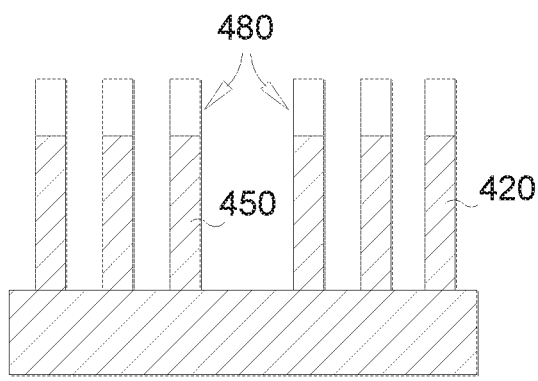
Figure 4B:
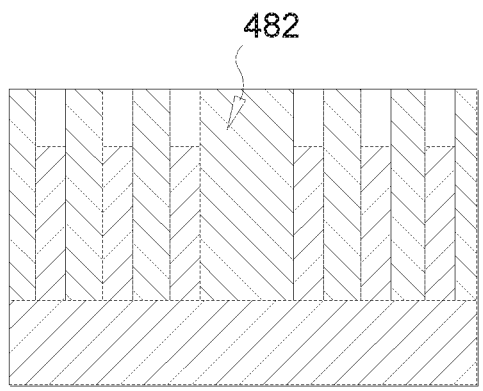
Figure 4C:
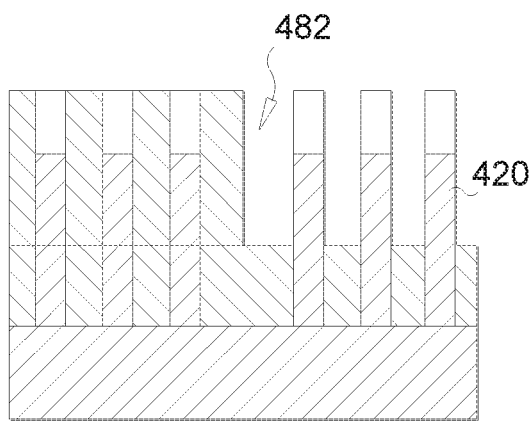

FIGS. 4A-I illustrate an exemplary partial method for manufacturing a transistor circuit with different fin widths in accordance with some examples of the disclosure. As shown in FIG. 4A, a partial method 400 for manufacturing a transistor circuit (e.g., transistor circuit 100) may begin with providing a common substrate 430, forming a plurality of first fins 420 for a first transistor 410, forming a plurality of second fins 450 for a second transistor 440, and applying a mask 480 (e.g., hard mask such as SiN) to a top portion of each first fin 420 and second fin 450. In addition, a dummy gate may be formed at this stage. The partial method 400 may continue in FIG. 4B with shallow trench isolation oxide 482 fill and planarization to level the top portion. The partial method 400 may continue in FIG. 4C with removal of a portion of the oxide 482 to reveal the first fins 420.

Figure 4D:
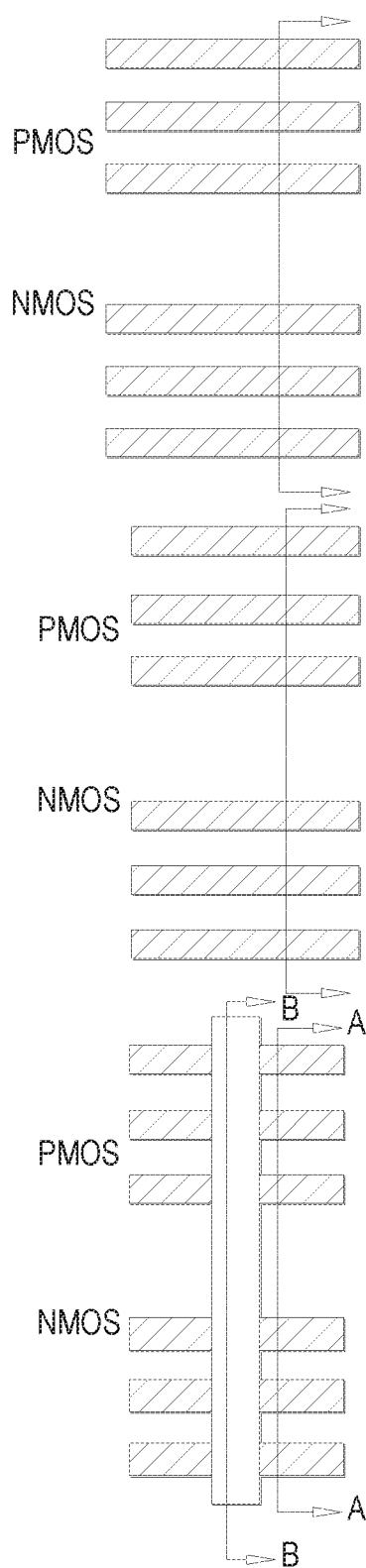
Figure 4D:
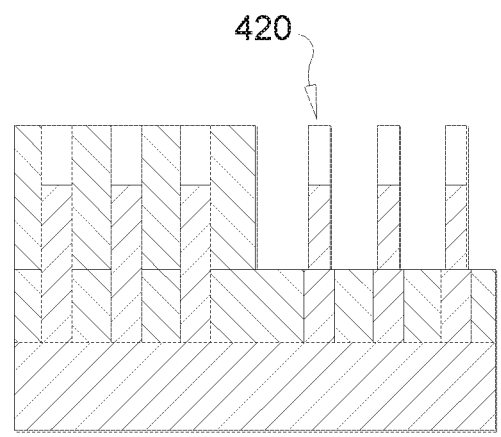
Figure 4E:
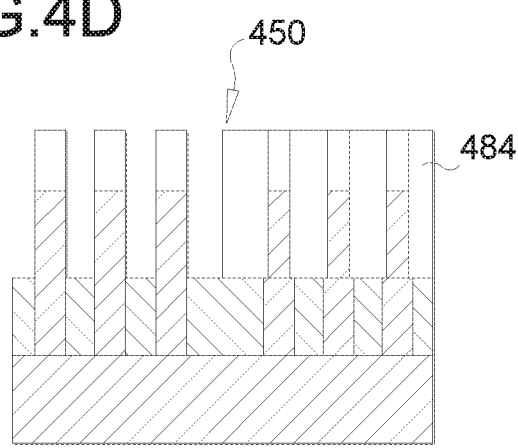
Figure 4F:
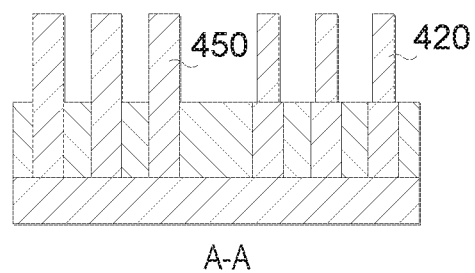
Figure 4F:
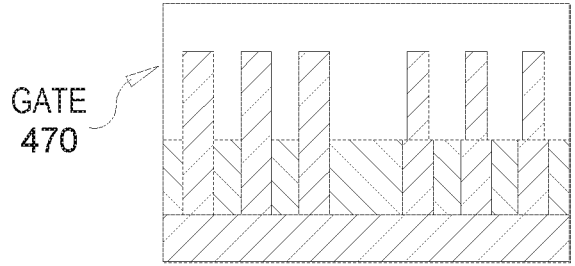

The partial method 400 may continue in FIG. 4D with trimming the first fins 420 to reduce the fin width or profile. The trimming may include oxidation and removing oxide from fin surface as shown. The partial method 400 may continue in FIG. 4E with masking the first fins 420 (e.g., a photo-resist film or mask) and removing oxide to reveal the second fins 450. The partial method 400 may continue in FIG. 4F with the removal of the various masks and formation of a common gate 470 around the first fins 420 and the second fins 450.

Figure 4G:
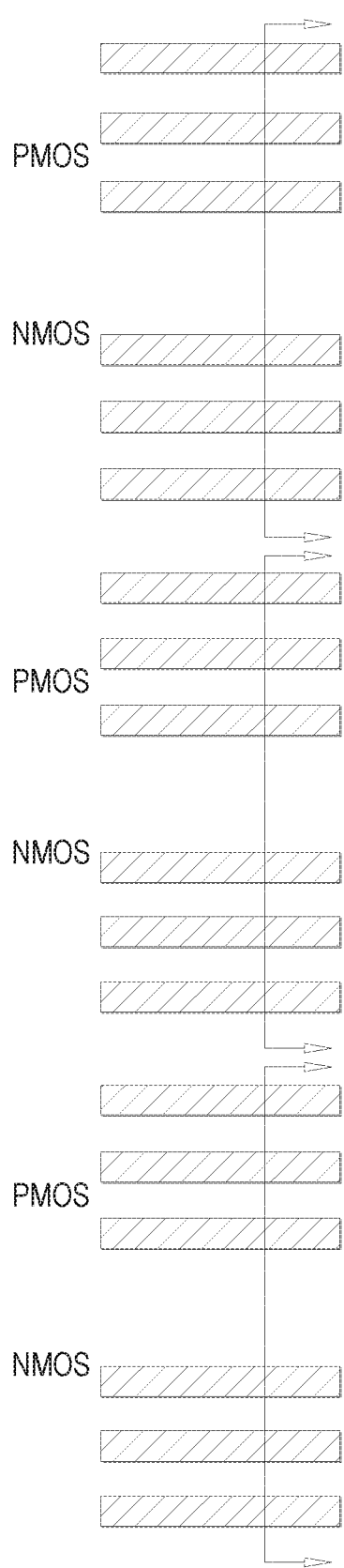
Figure 4G:
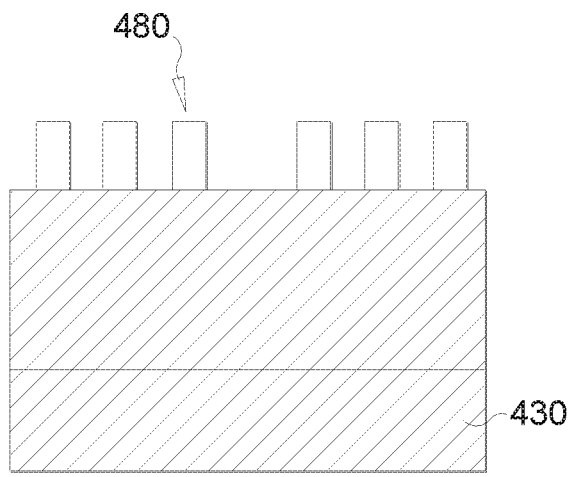
Figure 4H:
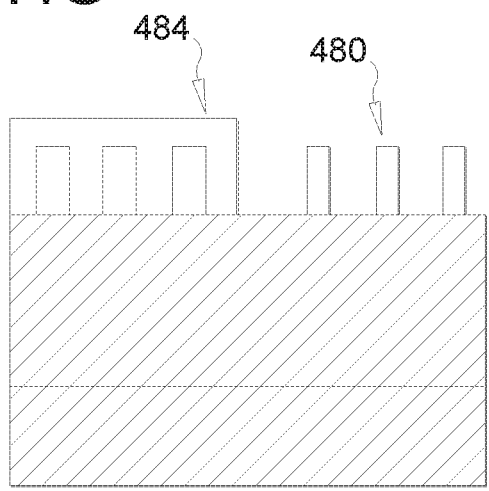
Figure 4I:
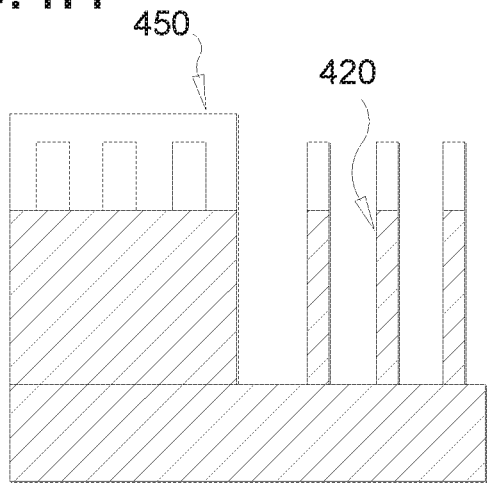

Alternatively, the partial method 400 may include formation of the first fins 420 separately from the second fins 450 as shown in FIGS. 4G-I. As shown in FIG. 4G, the partial method 400 may include providing a substrate 430, applying a mask 480 to locations that will become the first fins 420 and the second fins 450. As shown in FIG. 4H, the partial method 400 may include applying a mask 484 to the second fin 450 locations and trimming the mask 480 at the first fin 420 locations such that a first width of the first fins 420 will be less than or smaller than a second width of the second fins 450. As shown in FIG. 4I, the partial method 400 may include revealing the first fins 420 followed by revealing the second fins 450 (not shown).

Figure 5A:
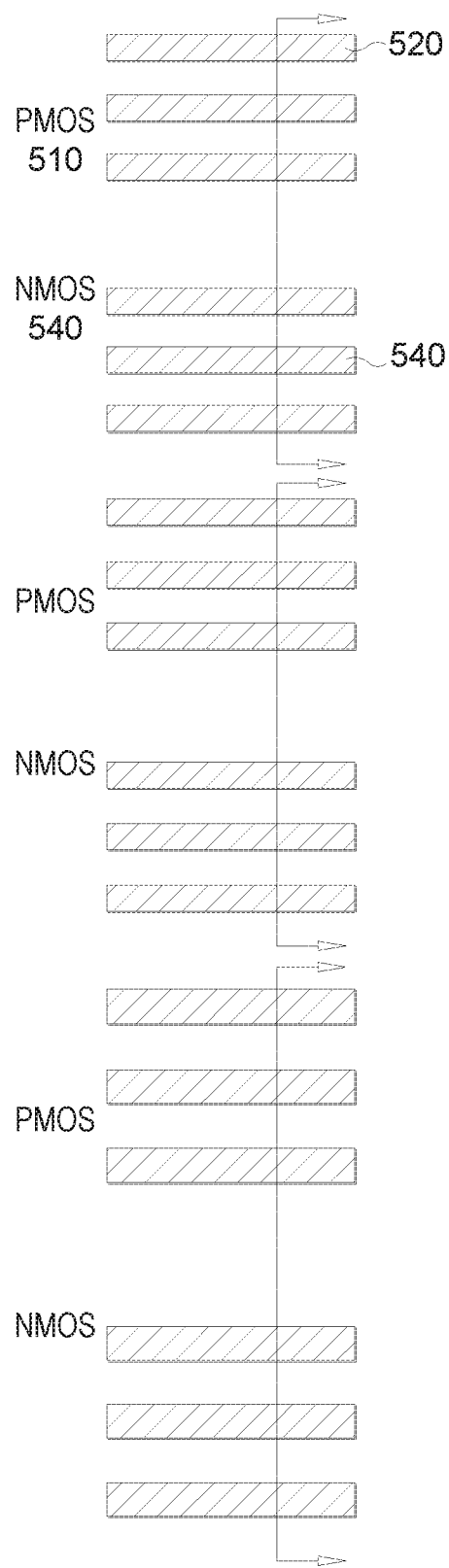
FIGS. 5A-C illustrate an exemplary partial method for manufacturing a transistor circuit with fin notches in accordance with some examples of the disclosure.
Figure 5A:
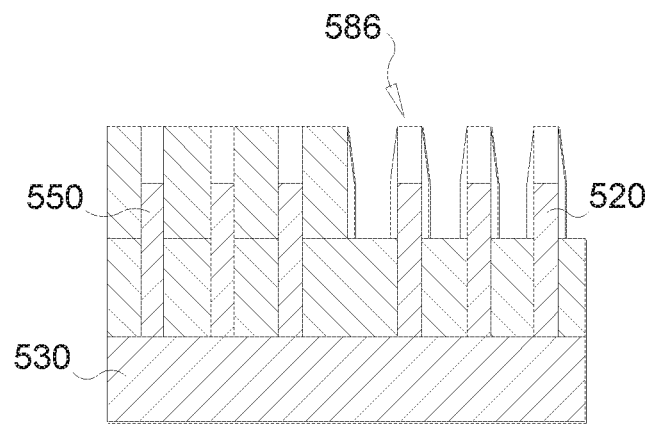
Figure 5B:
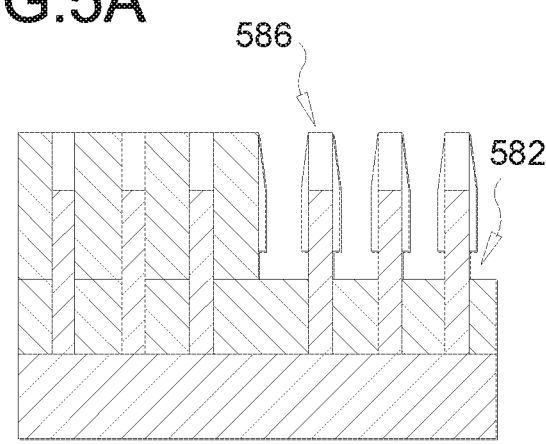
Figure 5C:
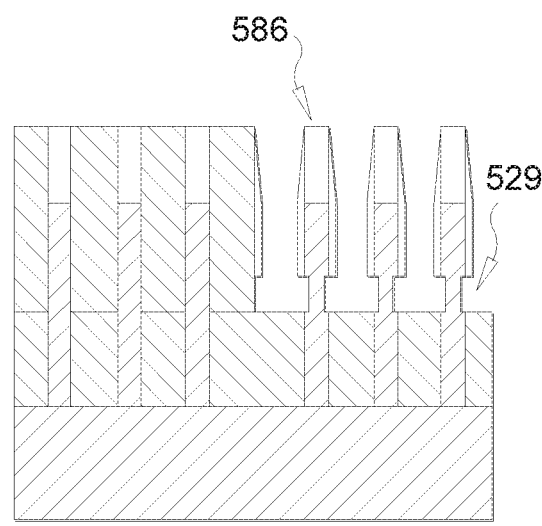

FIGS. 5A-C illustrate an exemplary partial method for manufacturing a transistor circuit with fin notches in accordance with some examples of the disclosure. As shown in FIG. 5A, a partial method 500 for manufacturing a transistor circuit (e.g., transistor circuit 200) may begin as illustrated in FIGS. 4A-D or 4G-I and include providing a common substrate 530, forming a plurality of first fins 520 for a first transistor 510, forming a plurality of second fins 550 for a second transistor 540, and forming a first fin spacer 586 on each of the first fins 520 near a top portion after partially recessing the oxide to reveal the first fins 520. The first fin spacer 586 may be formed by depositing a SiN layer and etching to form the first fin spacers 586. The partial method 500 may continue in FIG. 5B with removing oxide 582 below the first fin spacers 586 to reveal portions of the first fins 520. The partial method 500 may continue in FIG. 5C with trimming the first fins 520 below the first fin spacers 586 to reduce the fin width or profile to a first notch width 529. The trimming may include oxidation and removing oxide from fin surface as shown.

Figure 6A:
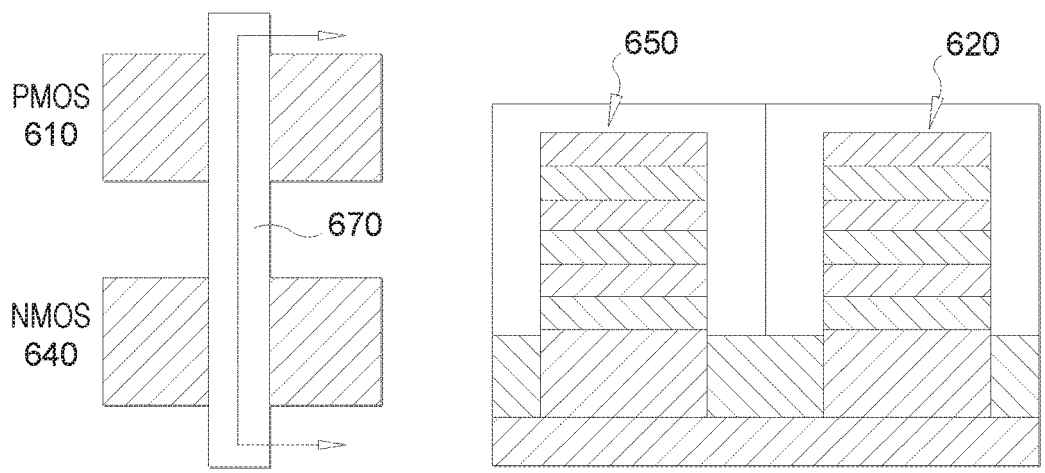
FIGS. 6A-C illustrate an exemplary partial method for manufacturing a transistor circuit with different nano-sheet thicknesses in accordance with some examples of the disclosure.
Figure 6B:
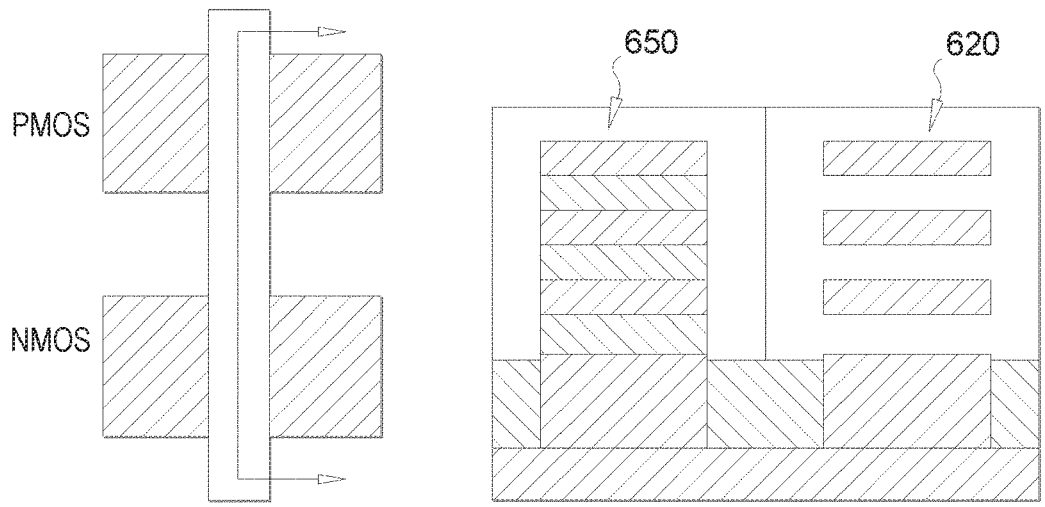
Figure 6C:
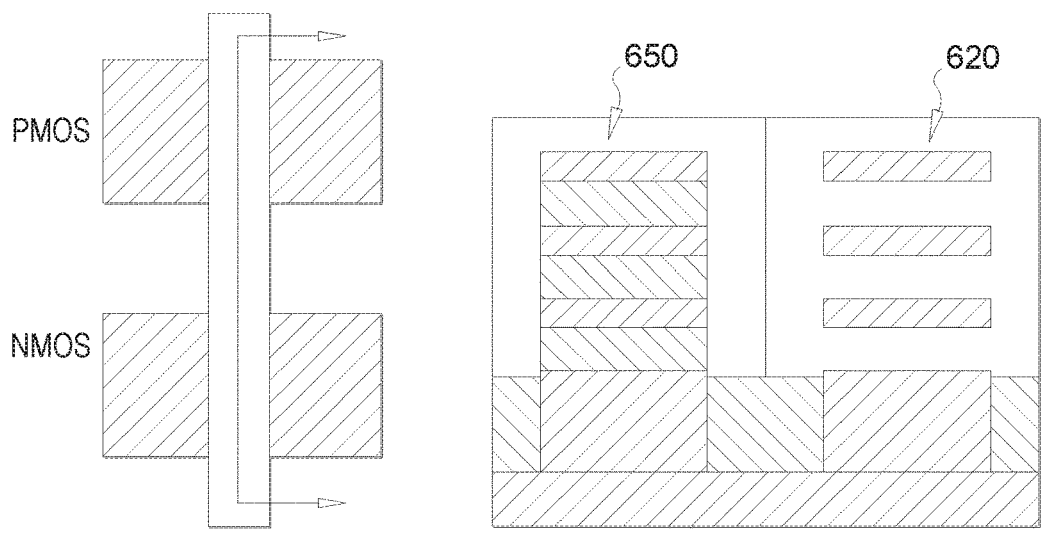

FIGS. 6A-C illustrate an exemplary partial method for manufacturing a transistor circuit with different nano-sheet thicknesses in accordance with some examples of the disclosure. As shown in FIG. 6A, a partial method 600 for manufacturing a transistor circuit (e.g., transistor circuit 300) may include providing a common substrate 630, forming a plurality of first channels 620 for a first transistor 610, and forming a plurality of second channels 650 for a second transistor 640. The channel forming may include forming multiple layers of Si and SiGe to form a dummy polysilicon gate and recess the dummy polysilicon in the first transistor 610 region. The partial method 600 may continue in FIG. 6B with removing SiGe selectively from the first transistor 610 region. The partial method 600 may continue in FIG. 6C with trimming the first channel 620 nano-sheets to reduce the channel width (i.e., thickness in vertical direction versus width in horizontal direction) or profile to less than a width (thickness) of a second channel 650.

Figure 7:
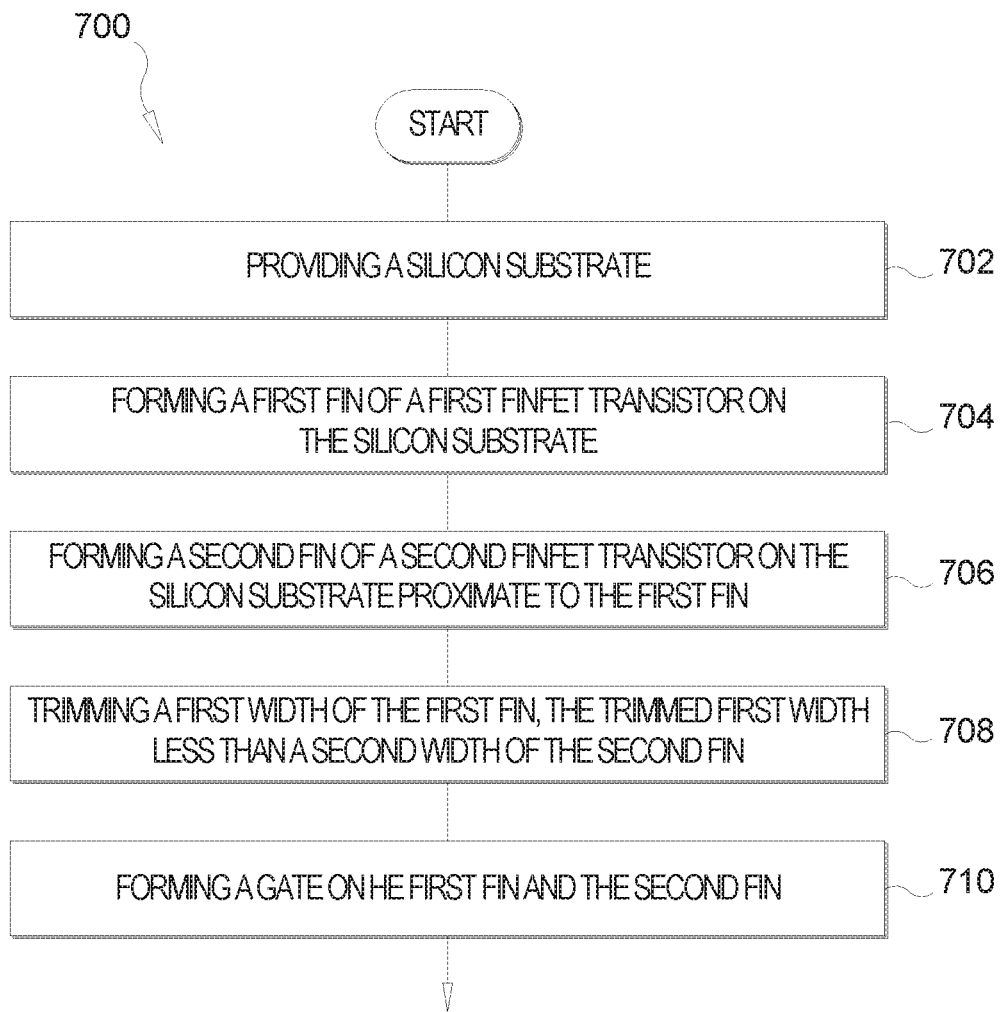
FIG. 7 illustrates an exemplary partial method for manufacturing a transistor circuit in accordance with some examples of the disclosure.

FIG. 7 illustrates an exemplary partial method for manufacturing a transistor circuit in accordance with some examples of the disclosure. As shown in FIG. 7, the partial method 700 may begin in block 702 with providing a silicon substrate. The partial method 700 may continue in block 704 with forming a first fin of a first finfet transistor on the silicon substrate. The partial method 700 may continue in block 706 with forming a second fin of a second finfet transistor on the silicon substrate proximate to the first fin. The partial method 700 may continue in block 708 with trimming a first width of the first fin, the trimmed first width less than a second width of the second fin. The partial method 700 may conclude in block 710 with forming a gate on the first fin and the second fin. Alternatively, the partial method 700 may include incorporating the transistor circuit into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 8:
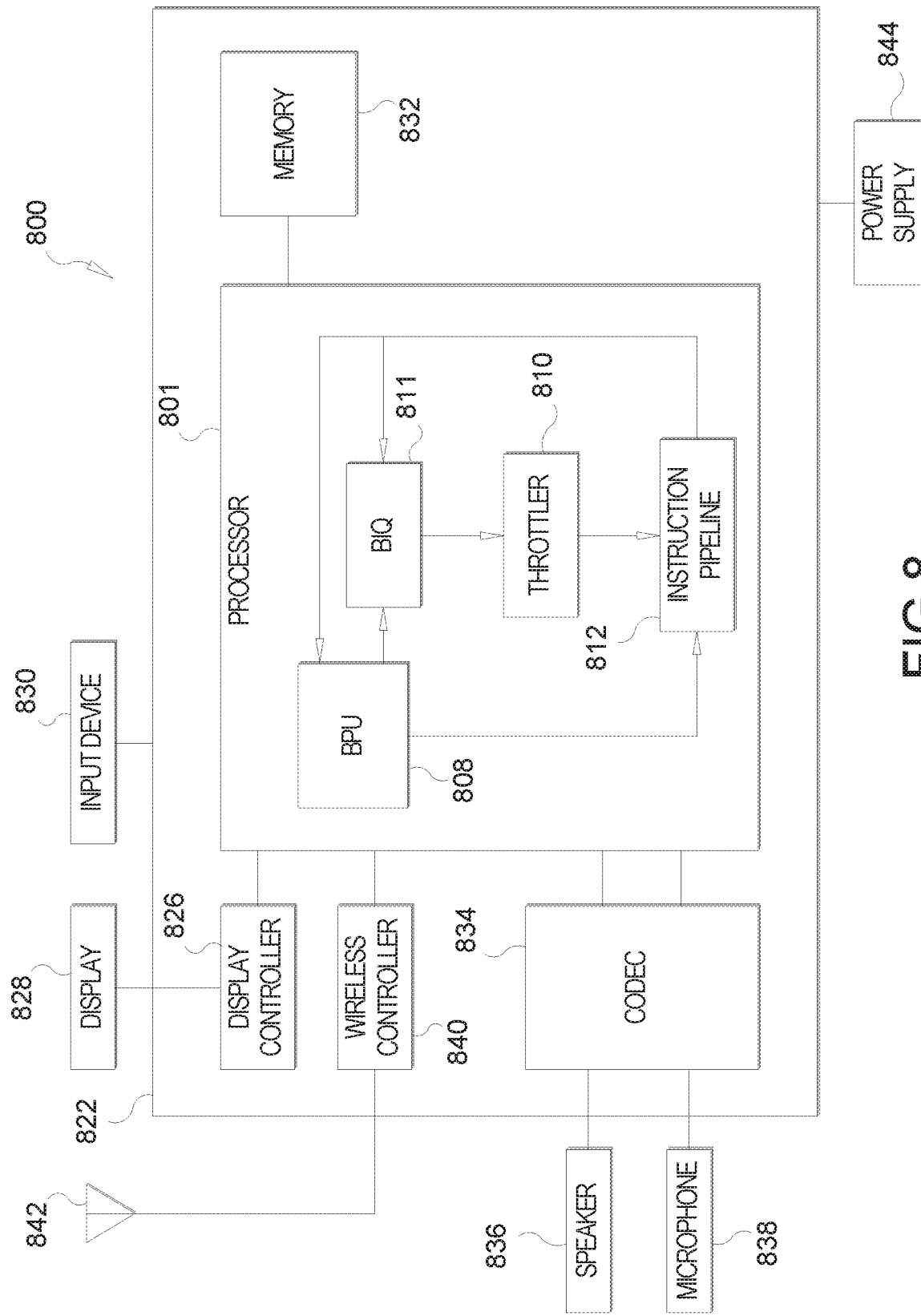
FIG. 8 illustrates an exemplary mobile device in accordance with some examples of the disclosure.

FIG. 8 illustrates an exemplary mobile device in accordance with some examples of the disclosure. Referring now to FIG. 8, a block diagram of a mobile device that is configured according to exemplary aspects is depicted and generally designated 800. In some aspects, mobile device 800 may be configured as a wireless communication device. As shown, mobile device 800 includes processor 801, which may be configured to implement the methods described herein in some aspects. Processor 801 is shown to comprise instruction pipeline 812, buffer processing unit (BPU) 808, branch instruction queue (BIQ) 811, and throttler 810 as is well known in the art. Other well-known details (e.g., counters, entries, confidence fields, weighted sum, comparator, etc.) of these blocks have been omitted from this view of processor 801 for the sake of clarity.

Processor 801 may be communicatively coupled to memory 832 over a link, which may be a die-to-die or chip-to-chip link. Mobile device 800 also include display 828 and display controller 826, with display controller 826 coupled to processor 801 and to display 828.

In some aspects, FIG. 8 may include coder/decoder (CODEC) 834 (e.g., an audio and/or voice CODEC) coupled to processor 801; speaker 836 and microphone 838 coupled to CODEC 834; and wireless controller 840 (which may include a modem) coupled to wireless antenna 842 and to processor 801.

In a particular aspect, where one or more of the above-mentioned blocks are present, processor 801, display controller 826, memory 832, CODEC 834, and wireless controller 840 can be included in a system-in-package or system-on-chip device 822. Input device 830 (e.g., physical or virtual keyboard), power supply 844 (e.g., battery), display 828, input device 830, speaker 836, microphone 838, wireless antenna 842, and power supply 844 may be external to system-on-chip device 822 and may be coupled to a component of system-on-chip device 822, such as an interface or a controller.

It should be noted that although FIG. 8 depicts a mobile device, processor 801 and memory 832 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 9:
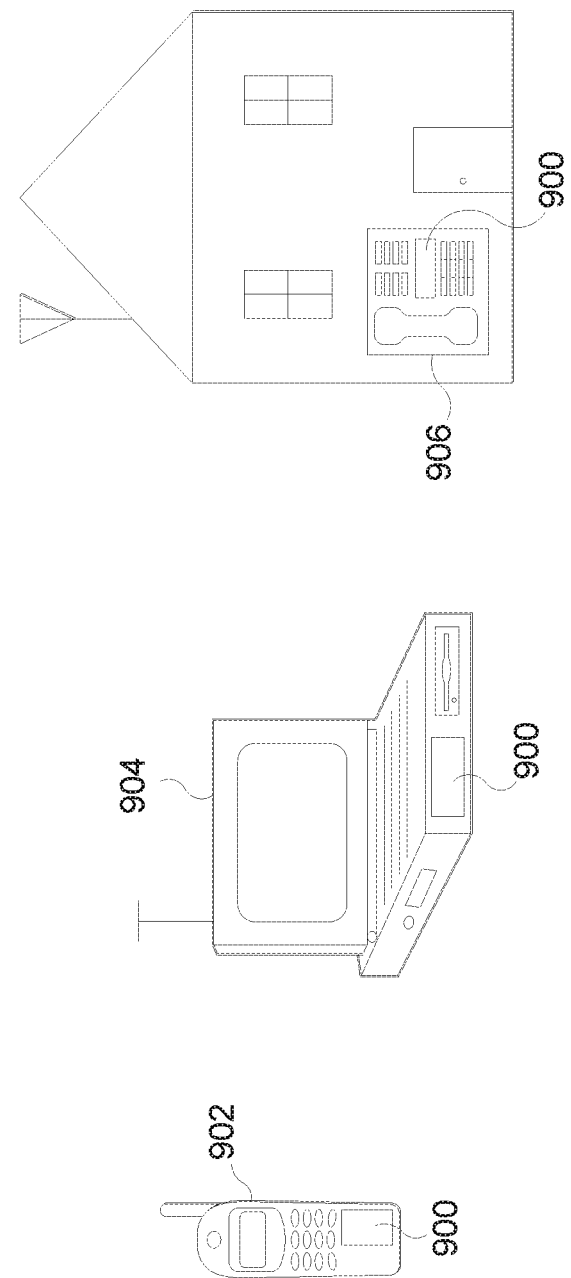
FIG. 9 illustrates various electronic devices that may be integrated with any of the aforementioned methods, devices, semiconductor devices, integrated circuits, die, interposers, packages, or package-on-packages (PoPs) in accordance with some examples of the disclosure.

FIG. 9 illustrates various electronic devices that may be integrated with any of the aforementioned integrated device, semiconductor device, integrated circuit, die, interposer, package or package-on-package (PoP) in accordance with some examples of the disclosure. For example, a mobile phone device 902, a laptop computer device 904, and a fixed location terminal device 906 may include an integrated device 900 as described herein. The integrated device 900 may be, for example, any of the integrated circuits, dies, integrated devices, integrated device packages, integrated circuit devices, device packages, integrated circuit (IC) packages, package-on-package devices described herein. The devices 902, 904, 906 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, a transistor circuit may comprises: a first means to amplify and switch (e.g., CMOS transistor, finfet transistor, GAA transistor, etc.) comprising a first fin with a first width; and a second means to amplify and switch comprising a second fin with a second width, wherein the first width is less than the second width. It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature or function or incorporated in several components, processes, or functions. Additional elements, components, processes, and/or functions may also be added without departing from the disclosure. It should also be noted that FIGS. 1-9 and its corresponding description in the present disclosure is not limited to dies and/or ICs. In some implementations, FIGS. 1-9 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A transistor circuit comprising:
   a first finfet transistor comprising a first fin with a first width, the first finfet transistor being configured as a p-type finfet;
   a second finfet transistor comprising a second fin with a second width, the second finfet transistor being configured as a n-type finfet, wherein the first width is less than the second width, and
   a gate on the first fin and the second fin.

2. The transistor circuit of claim 1, wherein the first width comprises a first top width and a first bottom width and the first top width is less than the first bottom width.

3. The transistor circuit of claim 2, wherein the first width further comprises a first notch width between the first top width and the first bottom width and the first notch width is less than the first bottom width.

4. The transistor circuit of claim 2, wherein the second width comprises a second top width and a second bottom width and the second top width is less than the second bottom width.

5. The transistor circuit of claim 4, wherein the first top width is less than the second top width, and the first bottom width is less than the second bottom width.

6. The transistor circuit of claim 1, wherein the first finfet transistor comprises a plurality of fins, the second finfet transistor comprises a plurality of fins, and each of the plurality of fins of the first finfet transistor has a smaller width than each of the plurality of fins of the second finfet transistor.

7. The transistor circuit of claim 1, wherein the transistor circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. A transistor circuit comprising:
   a first means to amplify and switch comprising a first fin with a first width, the first means to amplify and switch being configured as a p-type finfet;
   a second means to amplify and switch comprising a second fin with a second width, the second means to amplify and switch being configured as a n-type finfet, wherein the first width is less than the second width, and
   a gate on the first fin and the second fin.

9. The transistor circuit of claim 8, wherein the first width comprises a first top width and a first bottom width and the first top width is less than the first bottom width.

10. The transistor circuit of claim 9, wherein the first width further comprises a first notch width between the first top width and the first bottom width and the first notch width is less than the first bottom width.

11. The transistor circuit of claim 9, wherein the second width comprises a second top width and a second bottom width and the second top width is less than the second bottom width.

12. The transistor circuit of claim 11, wherein the first top width is less than the second top width, and the first bottom width is less than the second bottom width.

13. The transistor circuit of claim 8, wherein the first means to amplify and switch comprises a plurality of fins, the second means to amplify and switch comprises a plurality of fins, and each of the plurality of fins of the first means to amplify and switch has a smaller width than each of the plurality of fins of the second means to amplify and switch.

14. The transistor circuit of claim 8, wherein the transistor circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

15. A transistor circuit comprising:
   a first gate-all-around (GAA) transistor comprising a first channel with a first thickness in a first direction;
   a second GAA transistor comprising a second channel with a second thickness in the first direction, wherein the first thickness in the first direction is less than the second thickness in the first direction, and
   a shared gate on the first channel and the second channel, the first and second channels being spaced apart from each other in a second direction different from the first direction so that the first and second channels do not overlap with each other in the first direction within the shared gate.

16. The transistor circuit of claim 15, wherein the first GAA transistor is configured as a p-type GAA device.

17. The transistor circuit of claim 16, wherein the second GAA transistor is configured as a n-type GAA device.

18. The transistor circuit of claim 15, wherein the second GAA transistor is configured as a n-type GAA device.

19. The transistor circuit of claim 15, wherein the first GAA transistor comprises a plurality of channels, the second GAA transistor comprises a plurality of channels, and each of the plurality of channels of the first GAA transistor has a smaller thickness than each of the plurality of channels of the second GAA transistor.

20. The transistor circuit of claim 15, wherein the transistor circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method for manufacturing a transistor circuit, the method comprising:
   providing a silicon substrate;
   forming a first fin of a first finfet transistor on the silicon substrate;
   forming a second fin of a second finfet transistor on the silicon substrate proximate to the first fin;
   trimming a first width of the first fin without trimming a second width of the second fin, the trimmed first width less than the second width of the second fin; and
   forming a gate on the first fin and the second fin,
   wherein forming the first fin, forming the second fin, and trimming the first fin without trimming the second fin comprises:
      applying a mask to a first fin location and a second fin location, the first and second fin locations being locations on the silicon substrate to that will become the first fin and the second fin;
      trimming the mask at the first fin location without trimming the mask at the second fin location; and
      revealing the first fin followed by revealing the second fin.

22. The method of claim 21, wherein the first finfet transistor is configured as a p-type finfet.

23. The method of claim 22, wherein the second finfet transistor is configured as a n-type finfet.

24. The method of claim 21, wherein the second finfet transistor is configured as a n-type finfet.

25. The method of claim 21, wherein the first width comprises a first top width and a first bottom width and the first top width is less than the first bottom width.

26. The method of claim 25, wherein the first width further comprises a first notch width between the first top width and the first bottom width and the first notch width is less than the first bottom width.

27. The method of claim 21, further comprising forming a plurality of first fins and forming a plurality of second fins, wherein each of the plurality of first fins of the first finfet transistor has a smaller width than each of the plurality of second fins of the second finfet transistor.

28. The method of claim 21, further comprising incorporating the transistor circuit into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *